United States Patent
Niwa et al.

(10) Patent No.: US 6,798,707 B2
(45) Date of Patent: Sep. 28, 2004

(54) MEMORY CONTROL APPARATUS FOR SERIAL MEMORY

(75) Inventors: Akimasa Niwa, Toyoake (JP); Takuya Harada, Kariya (JP); Takayuki Aono, Toyoake (JP); Shuji Agatsuma, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/234,132

(22) Filed: Sep. 5, 2002

(65) Prior Publication Data

US 2003/0043670 A1 Mar. 6, 2003

(30) Foreign Application Priority Data

Sep. 6, 2001 (JP) ........................................ 2001-270566

(51) Int. Cl.$^7$ ................................................. G11C 7/00
(52) U.S. Cl. ................. 365/221; 365/189.12; 365/233.5
(58) Field of Search ........................... 365/221, 189.01, 365/233.5, 233, 219, 78

(56) References Cited

U.S. PATENT DOCUMENTS 5,243,561 A    9/1993  Yamauchi
6,081,480 A    6/2000  Suzuki
6,359,822 B1 * 3/2002  Zink et al. .................. 365/221

FOREIGN PATENT DOCUMENTS

| JP | 63-260242  | 10/1988 |
| JP | 4-114289   | 4/1992  |
| JP | 6-295259   | 10/1994 |
| JP | 6-309887   | 11/1994 |
| JP | 2545478    | 7/1996  |
| JP | 11-177543  | 7/1999  |

* cited by examiner

Primary Examiner—David Lam
(74) Attorney, Agent, or Firm—Posz & Bethards, PLC

(57) ABSTRACT

A memory control apparatus for controlling the operation of a memory array in a serial memory employs a command control section for registering the bits of an instruction which is received as an externally supplied set of serial data in conjunction with a corresponding series of cycles of a clock signal, with each set of serial data formatted as a command data portion preceded by a start bit, whereby the shifting of the start bit into the MSB stage of the shift register is detected and used to terminate supplying the clock signal to the shift register, thereby eliminating the use of a counter circuit. Any additional clock signal cycle following shifting of the start bit into the MSB stage of the shift register is detected, so that operating errors caused by noise in the received clock signal can be reliably eliminated.

9 Claims, 6 Drawing Sheets

MEMORY CONTROL APPARATUS FOR SERIAL MEMORY

BACKGROUND OF INVENTION

1. Field of Technology

The present invention relates to a memory control apparatus which performs memory control by utilizing serial data, and to a serial memory which receives and outputs data in serial form.

2. Description of Prior Art

In the prior art, a type of serial EEPROM (electrically erasable programmable memory) is known whereby data are transferred between the memory and external circuits via a serial interface. Such a serial EEPROM basically consists of a memory array and a control circuit which performs functions whereby portions of an externally supplied input serial data stream which constitute control information (e.g., such as memory read or write instructions) are converted to parallel form and decoded, and whereby address and data portions of the input serial data are converted to parallel form and supplied to the memory array, and further whereby sets of parallel data which are read out from the memory array are converted to serial form.

The term "memory" alone is used herein to signify a device that is a combination of a control circuit and a memory array (i.e., array of memory cells) as described above, that is to say, a combination which may be formed on an integrated circuit chip as a single device.

Such a control circuit includes a start bit detection circuit which detects start bits that occur within the input serial data, and a shift register which (when a start bit has occurred) successively registers a set of serial data bits which succeed a start bit, to thereby convert each such set into parallel data form. The registering of successive input data bits in the shift register is performed under the control of (i.e., synchronized with) a clock signal, which will be referred to in the following as the operating clock signal, which is also externally supplied. Frames of input serial data are thereby converted to respective sets of parallel data. With such a control circuit, when the start bit detection circuit detects occurrence of a start bit in the input serial data stream, the shift register is set in operation to acquire the serial data. When a predetermined number of bits have been set into the shift register, the shifting operation is halted, to prevent overflow.

A specific example of such a control circuit is described in Japanese Patent HEI 4-114289. In that example, a counter is utilized, which counts up to a specific number of cycles of the operating clock signal. When a start bit is detected in the input serial data stream, supplying of the operating clock signal to the shift register is started, while at the same time the counter is set in operation. When the counter reaches the predetermined count value, the supplying of the operating clock signal to the shift register is halted, to thereby halt the operation of the shift register.

However since such a counter is large in circuit scale, incorporation of the counter results in the overall size of the control circuit becoming large. Furthermore, due to the fact that shift register control is implemented by using a counter, if a count error occurs due to the effects of noise, etc., then the count value will not correspond to the actual state of the shift register. Hence, errors in the operation of the control circuit may occur, as a result of the effects of noise.

Another problem of the prior art is as follows. The length of each of the instructions which serve to control the operation of an EEPROM should preferably be as short as possible, in order to minimize the circuit scale of the control circuit and to maximize the performance of the circuit which decodes these instructions. Such an instruction set may for example include instructions that are used for debugging, i.e., special instructions that will not normally be required. However if such special instructions are handled at the same level as the usual instructions (i.e., the instructions which are used to control the operation of the EEPROM under normal circumstances) then the processing performance for usual instructions will be lowered.

On the other hand, if the control circuit is to be configured such as to be capable of using variable-length instructions, so that special instructions can be conveyed by greater numbers of bits than usual instructions, then the circuit may be formed with an area that serves to handle the usual instructions and an extension area which is used to handle the special instructions. However in order to be able to handle such variable-length instructions, it is necessary for some way to be provided for notifying the memory control circuit of the instruction length. For example, additional control terminals might be provided to receive such notification information. However this results in the overall chip size being increased, when the control circuit is formed on an integrated circuit chip.

Moreover another problem arises when designing a control circuit which must handle such variable-length instructions. Specifically, the frame format for the sets of serial data that are sent to or transmitted from the memory will vary, in accordance with whether a usual instruction or a special instruction is conveyed. Thus, the shift register locations (stages) into which the bits of a usual instruction will be set will differ, depending upon whether the control circuit is designed to handle only usual instructions (and so does not have an extension region) or is designed to also handle variable-length instructions (and so has an extension region). As a result, the design of the decoder circuit which operates on the data held in the shift register will become complex, and the overall circuit scale will be increased.

It is an objective of the present invention to overcome the above problems of the prior art, by providing a memory control apparatus and a serial memory whereby the occurrence of operating errors due to electrical noise can be prevented while in addition the circuit scale can be small and the circuit power consumption can be low.

It is a further objective of the invention to provide such a memory control apparatus, configured such as to have a capability for expansion when necessary for handling variable-length instructions, with the bits expressing a usual instruction being always produced from one specific part of the control circuit, and without requiring the provision of additional terminals for receiving information notifying of variable-length instructions.

SUMMARY OF THE INVENTION

To achieve the above objectives, according to a first aspect, which relates to a memory which receives serial data conveying fixed-length instructions together with an operating clock signal that is synchronized with the serial data, with each instruction being expressed by a command data portion of a fixed-length data frame and with the command data portion being preceded by a start bit, the invention basically provides a memory control apparatus which incorporates serial data registering means having the following features. A shift register is provided, having a number of register stages that is identical to the frame length (i.e., number of bits of a command data portion, incremented by one), with the shift register being reset prior to setting a new set of data therein, i.e., each time that an operation such as instruction execution based on a received serial data frame has been completed. Specifically, each shift register stage is initialized to a logic level that is the inverse of that of the start bits. A start bit detection circuit generates a start bit detection signal when occurrence of a start bit is detected in the input serial data, and a clock control circuit enables supply of the operating clock signal, as a shift clock, to the shift register during an interval which extends from the point at which the start bit detection signal begins to be generated until the point at which the logic level of the MSB output of the shift register becomes inverted. That is to say, when a serial data frame is correctly received, the supply of the operating clock signal to the shift register is continued until all of the frame bits have been set into the shift register, with the start bit having thus been shifted into the MSB stage of the shift register.

In addition, an excess clock detection circuit is provided, which generates an excess clock detection signal in the event that at least one cycle of the operating clock signal is received after the aforementioned logic level inversion of the MSB output has occurred.

As a result, if electrical noise has been induced in the connecting lead which supplies the operating clock signal from an external source, and has caused at least one of the bits of a frame to be shifted into the shift register more than once during a single clock cycle (thereby causing the start bit to be set in the MSB stage of the shift register prematurely), so that one or more excess operating clock signal cycles are received after the logic level of the MSB output of the shift register has been inverted, this condition is immediately detected. In a described embodiment, an error control section responds to the excess clock detection signal by immediately resetting the shift register to the initialized state, so that no errors in controlling the memory array will occur.

In that way, it becomes unnecessary to utilize a counter circuit for controlling the supply of the operating clock signal to the shift register, so that the overall circuit scale can be minimized. In addition it becomes possible to eliminate any adverse effects of electrical noise which may be contained in the received operating clock signal.

More specifically, according to a first aspect, the invention provides a memory control apparatus having serial data registering means for outputting data to control a memory array, with the data registering means receiving serial data and a corresponding operating clock signal from an external source, in which the serial data registering means comprises:

start bit detection means, which generates a start bit detection signal when a start bit is received in the serial data, a shift register controlled by the operating clock signal to register a number of bits of the serial data which is equal to the command data portion bit length incremented by one, and which is initialized such that logic levels of the outputs from the respective shift register stages are set as the inverse of the logic level of the start bits (i.e., the "1" state logic level) after a memory control operation using the output data from the shift register has been completed, clock control circuit means functioning, during an interval extending from the start of generating the start bit detection signal until the logic level of the output from the MSB stage of the shift register is inverted to the start bit logic level (i.e., when the state of a received start bit is shifted into the MSB stage of the shift register), to supply the operating clock signal as a shift clock to the shift register, and excess clock detection means responsive to occurrence of at least one cycle of the operating clock signal, subsequent to the inverting of the MSB logic level, for generating an excess clock detection signal.

According to a second aspect, the invention provides a memory control apparatus having serial data registering means performing a similar function to that described above, but which is capable of registering variable-length instructions. In that case, an instruction other than a usual instruction (i.e., a special instruction, which has a longer bit length than a usual instruction) is formed as one or more command data portions, each preceded by a start bit, which consecutively follow a command data portion that has the same bit length as a usual instruction. A plurality of control blocks are provided, each of which performs the various functions described above, other than the start bit detection function, and contains a shift register capable of registering a bit length which is identical to a specific corresponding command data portion of a usual instruction or of a special instruction.

A separate start bit detection circuit supplies the start bit detection signal to a first-stage control block (which registers the bits of a usual instruction, or of the leading portion of a special instruction). Thus, the first-stage control block operates as described above, however if a special instruction is received (so that corresponding operating clock cycles continue to be received on completion of setting data into the shift register of that control block) the output signal from the excess clock detection signal of the first-stage control block is applied to enable supply of the operating clock signal to the shift register of the second-stage control block. Third and subsequent stage control blocks are similarly controlled, by the excess clock detection signal from the preceding-stage control block.

In that way it becomes possible to ensure, for example, that the bits of a usual instruction will always be outputted from one specific shift register, irrespective of how many control blocks are incorporated, i.e., irrespective of the number of different lengths of instruction which the memory control apparatus is designed to be capable of handling.

DESCRIPTION OF PREFERRED
EMBODIMENTS

First Embodiment

Figure 1A:
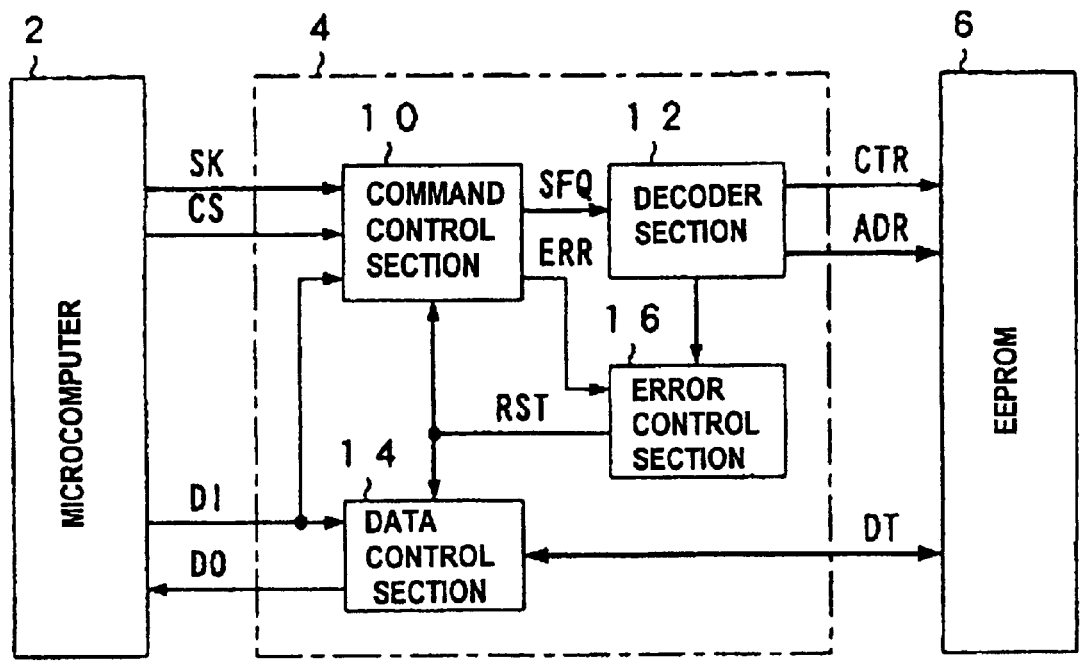
FIG. 1A is a system block diagram showing the overall configuration of a memory control apparatus according to the present invention.

FIG. 1A is a block diagram of an embodiment of a memory control apparatus 4, which receives input data DI from an external source indicated as a microcomputer 2 (where "microcomputer" could be a microprocessor, personal computer, etc.,) together with an operating clock signal SK and a chip select signal CS, and thereby performs access control of an EEPROM 6 for transferring data from the microcomputer 2 to be written into the EEPROM 6 and to transfer data read out from the EEPROM 6 to the microcomputer 2. For simplicity of description, a device such as the EEPROM 6 will be referred to as a "memory array", with description of circuits for directly effecting memory read and write operations on memory cells being omitted. The input serial data from the microcomputer 2 are supplied as successive frames having a fixed frame format, where the term "frame" as used herein signifies only a discrete set of serially transferred bits having a specific format, which in the case of this embodiment is fixed. The memory control apparatus 4 converts data of each of these frames into parallel data form, for transfer to a memory array in the EEPROM 6.

Figure 1B:
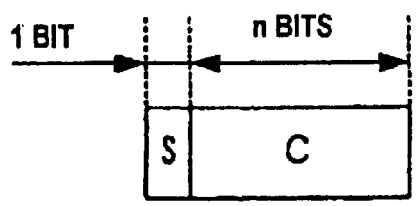
FIG. 1B illustrates the frame format of serial data supplied to such a memory control apparatus.

FIG. 1B illustrates the frame format of the serial data DI with this embodiment.

As shown in FIG. 1A, the memory control apparatus 4 includes a command control section 10 which receives serial data DI supplied from the microcomputer 2, with the data of each frame of serial data being successively written into a shift register within the command control section 10 (as described hereinafter) in synchronism with the operating clock signal SK, while the chip select signal CS is asserted. When a frame of serial data DI have been completely transferred into the shift register within the command control section 10, they are read out in parallel form, with that set of parallel data outputs being designated as SFQ in FIG. 1A. The command control section 10 may also generate an error detection signal ERR, as described hereinafter.

The memory control apparatus 4 further includes a decoder section 12 which, when the parallel data SFQ produced from the command control section 10 expresses an instruction, operates on these data to generate control (CTR) and address (ADR) signals required for accessing the EEPROM 6.

The memory control apparatus 4 also includes a data control section 14 which functions, when a memory read operation is performed, to convert a set of parallel data DT read out from the microcomputer 2 into serial form, as data DO which are transferred to the microcomputer 2, and when a memory write operation is performed, to convert a frame of serial data DI supplied from the microcomputer 2 into parallel form, as data DT which are transferred to the EEPROM 6.

The memory control apparatus 4 further includes an error control section 16, which generates a reset signal RST when the error signal ERR from the command control section 10 is asserted, or in response to a control signal produced from the decoder section 12 (e.g., upon completion of executing an instruction), with the reset signal RST acting to reset both the command control section 10 and the data control section 14.

In the following it is assumed for the purpose of description that a frame of serial data DI which is sent from the microcomputer 2 conveys an instruction, to be applied to control the EEPROM 6.

As shown in FIG. 1B, each frame of serial data DI has a frame format consisting of a 1-bit header, referred to as the start bit S, followed by a data portion formed of a set of n bits (where n is a fixed plural integer) which will be referred to as the command data portion C. With this embodiment, under a condition in which no data DI are being transferred from the microcomputer 2, the signal line which conveys these data is held at the low logic level (referred to in the following simply as the L level), whereas a start bit S attains the high logic level (H level).

Figure 2:
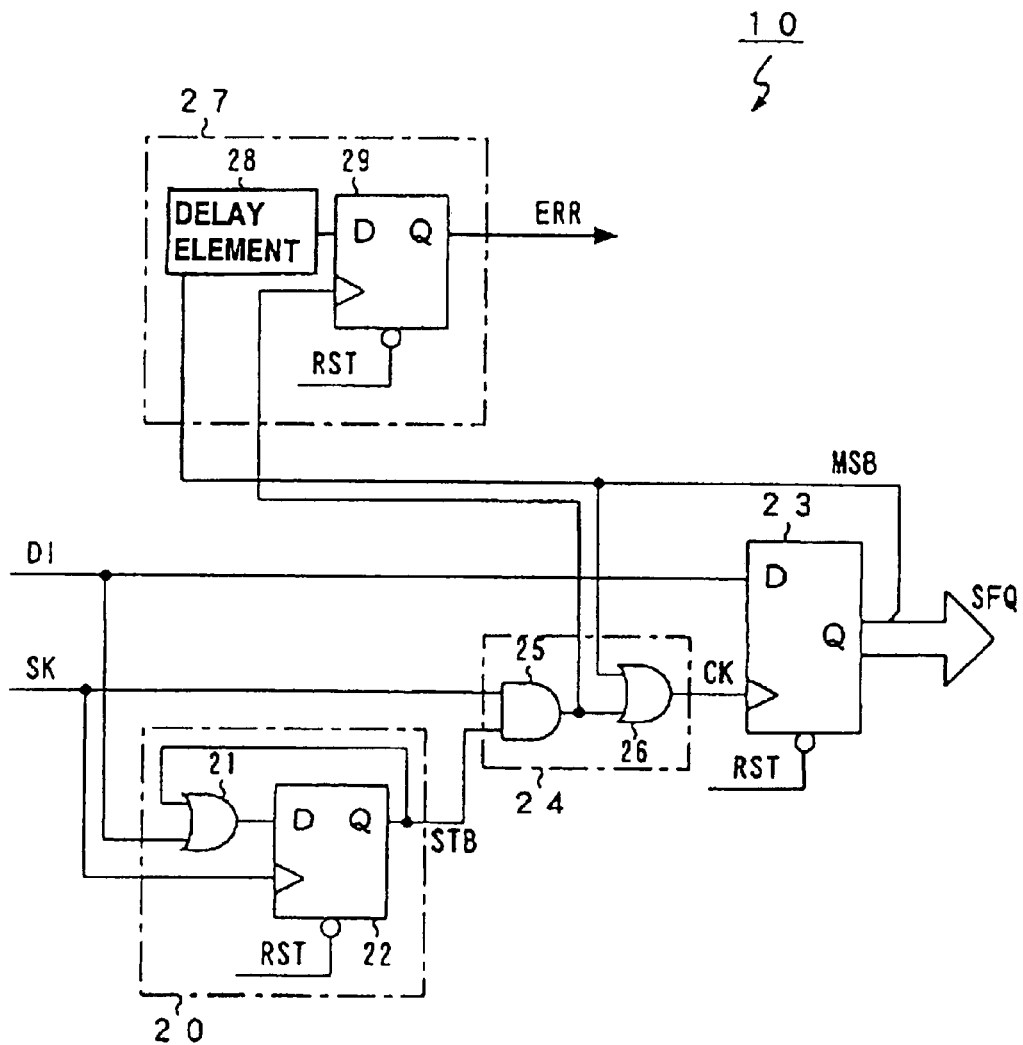
FIG. 2 is a circuit diagram of a first embodiment of a command control section used in the memory control apparatus of FIG. 1.

FIG. 2 is a circuit block diagram of the command control section 10, which constitutes the main part of this embodiment. As shown in FIG. 2, the command control section 10 includes a start bit detection circuit 20 which serves to detect occurrence of a start bit S in the input serial data DI, and for producing a signal STB at the H level when such occurrence is detected. The command control section 10 further includes a shift register 23 which is an (n+1)-bit shift register, which registers a frame of serial data D1 (having the frame format shown in FIG. 1B and described above) in synchronism with a clock signal CK, to thereby convert the serial data DI to parallel data SFQ. The command control section 10 further includes a clock supply control circuit 24, which derives the aforementioned clock signal CK from the input clock signal SK under a condition in which the MSB (most significant bit) of the data SFQ is at the L level and the signal STB is at the H level. The command control section 10 further includes an excess clock detection circuit 27, which serves to detect any excess cycle of the operating clock signal SK which may occur after all of a frame of input data DI have been shifted in the shift register 23, and sets an output signal ERR to the H level when such occurrence is detected.

The start bit detection circuit 20 is made up of an OR gate 21 and a D-type flip-flop (DFF) 22, configured as shown. The OR gate 21 supplies an H level signal to the DFF 22 when either of the serial data DI or the output from the DFF 22 is at the H level. The output from the DFF 22, i.e., the start bit detection signal STB is reset to the L level when the reset signal RST is asserted (goes to the L level), and is set to the H level when an H to L level transition of the operating clock signal SK occurs while the input signal to the D input terminal of DFF 22 is at the H level. Thus, once the start bit detection signal STB has been set to the H level, it remains in that condition until the DFF 22 is reset by the reset signal RST.

The clock supply control circuit 24 is formed of an AND gate 25 which receives the start bit detection signal STB and the operating clock signal SK, and an OR gate 26 which receives the output from the AND gate 25 and the MSB of the output data SFQ from the shift register 23. The clock supply control circuit 24 thereby supplies to the shift register 23 a number of cycles of the clock signal SK that is identical to the number of bits of a frame of serial data DI including the start bit, as the clock signal CK, since while the start bit detection signal STB is at the L level, or the MSB of the outputs from the shift register 23 is at the H level, the operating clock signal SK is inhibited from being supplied to the shift register 23 as the clock signal CK.

After the shift register 23 has been reset by the reset signal RST, then when the supply of the clock signal CK is subsequently restarted as a result of the start bit S having been detected (i.e., the start bit detection signal STB has gone to the H level) the shift register 23 successively registers the bits of a frame of serial data DI in synchronism with the clock signal CK. When the MSB of the data registered in the shift register 23 thereafter goes from the L to the H level, (as a result of a start bit being shifted into the MSB stage of the shift register) the operation of the shift register 23 is halted, and the data SFQ held in the shift register at that time are then supplied in parallel to the decoder section 12.

The excess clock detection circuit 27 is formed of a delay element 28, which delays the MSB output from the shift register 23, and a DFF 29 which latches the level of the serial data DI at each transition from L to H level of the clock signal SK which is supplied via the AND gate 25, to assert an excess clock detection signal ERR at the H level. That ERR output signal is reset to the L level by the reset signal RST and thereafter, if at least one cycle of the operating clock signal SK should be received after the MSB output from the shift register 23 has gone to the H level, the excess clock detection signal ERR goes to the H level. The delay element 28 serves to ensure that the timing of an input which is supplied to the D (data) input terminal of the DFF 29 will not be advanced with respect to the clock signal SK. However if there is already a sufficient amount of delay in the MSB output of the shift register 23, then it may be possible to omit the delay element 28.

The decoder section 12 decodes the data SFQ which are supplied from the command control section 10, and when it is determined that normal completion has been achieved by using the decoded results, i.e., that execution of an instruction conveyed by the data SFQ has been completed, or if it is not possible to decode the data SFQ, then a reset request is sent to the error control section 16. When such a reset request is sent, or the excess clock detection signal ERR goes to the H level, the error control section 16 asserts the reset signal RST at the L level.

In addition, although not shown in the drawings, the error control section 16 is configured such that if the chip select signal CS goes from the H to the L level before completion of an operation based on decoded results from the decoder section 12, then the reset signal RST is asserted.

Figure 3A:
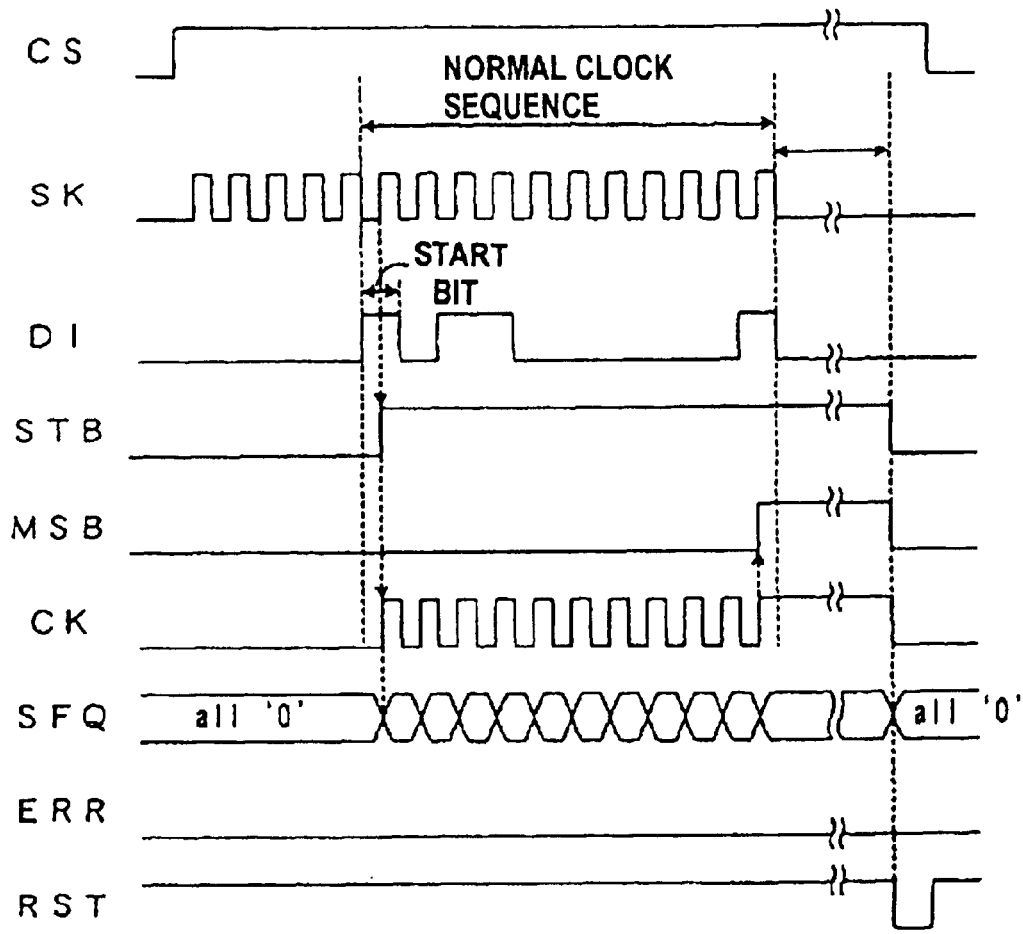
FIGS. 3A, 3B are timing diagrams for describing the operation of the command control section of FIG. 2.
Figure 3B:
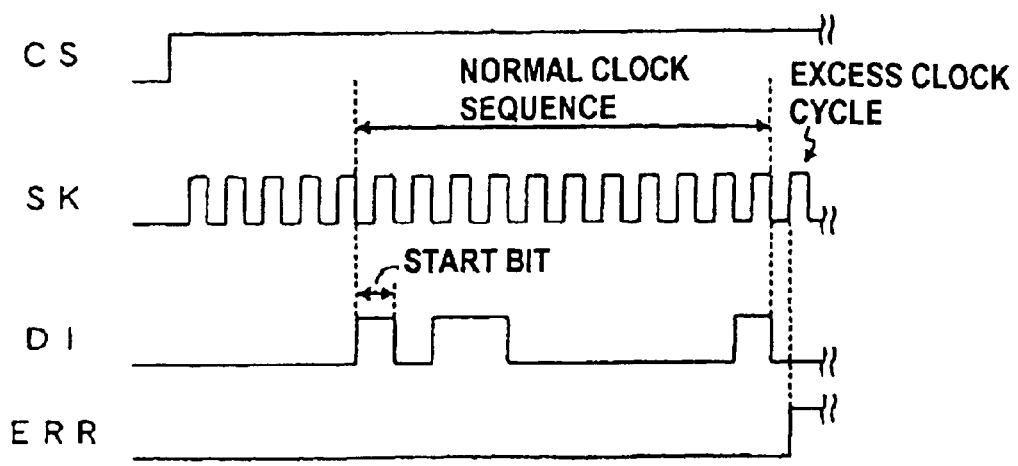

FIGS. 3A, 3B are timing diagrams for use in describing the operation of the various sections of the command control section 10. Although not shown in FIG. 2, the command control section 10 is configured such as to be only able to acquire the clock signal SK and the serial data DI from the microcomputer 2 when the chip select signal CS is at the H level. In the following, it will be assumed that a frame of serial data DI constituting an instruction are sent from the microcomputer 2. At the starting time point of these timing diagrams, the various circuit sections have previously been reset by the reset signal RST. In particular, each of the outputs from the shift register 23 have been reset to the L level, i.e., the inverse level to that of the start bits. As shown in FIG. 3A, when the chip select signal CSS has gone to the H level and the clock signal SK has started to be supplied to the command control section 10, that circuit will remain in the inoperative state so long as the input serial data DI remains at the L level (i.e., indicating no data input). When the serial data DI then first goes to the H level, i.e., the start bit S occurs, the start bit detection signal STB goes to the H level, and the masking of the operating clock signal SK is thereby removed, so that the clock signal CK begins to be supplied to the shift register 23.

Thereafter, a total of (n+1) bits including the start bit S (where n will be assumed to be 10, in this example) of the serial data DI are shifted successively into the shift register 23, i.e., by a series of (n+1) cycles of the clock signal SK, indicated as the "normal clock sequence" in FIGS. 3A, 3B. As shown in FIG. 3A, the invention utilizes the fact that the operating clock signal SK is sent from the microcomputer 2 as respective sets of clock cycles, with each set terminating at the same timing as the end of the corresponding frame of the serial data DI, i.e., at the termination of the normal clock sequence.

When the MSB output of the shift register 23 then changes from the L to the H level (as a result of the logic level of a start bit having been shifted into the MSB stage of the shift register) the supply of the clock signal CK to the shift register 23 is thereby halted, and the data which have been shifted into the shift register 23 up to that point are left registered therein.

These data are then decoded by the decoder section 12, and instruction execution is then performed, based on the decoded results, with the condition of the shift register 23 being left unchanged. When execution of the instruction has been completed, the reset signal RST is generated, thereby resetting the various circuit sections.

After the MSB of the shift register 23 has reached the H level, if one or more further cycles of the clock signal SK should continue to be inputted to the command control section 10, then as shown in FIG. 3B the excess clock detection signal ERR goes to the H level. As a result, the error control section 16 immediately outputs the signal RST (not shown in FIG. 3B), causing the data which have been written into the shift register 23 to be deleted. As noted above, the normal clock sequence ends in synchronism with the final bit (i.e., LSB) of a serial data set that is preceded by start bit. However if for example even a single noise spike is induced on the leads which supply the operating clock signal SK from the microcomputer 2, then a bit of the serial data DI may be shifted into the shift register 23 twice in succession within a single clock cycle, thus causing the MSB output to go to the H level prematurely, and causing the data SFQ to be incorrect. This would result in one excess cycle of the clock signal SK occurring as illustrated in FIG. 3B.

With this embodiment as described in the above, the memory control apparatus 4 functions such that the clock signal CK is supplied to the shift register 23 only in a time interval which extends from the point at which a start bit S is detected until the point at which that start bit S becomes the MSB of the data held in the shift register 23. Hence it can be reliably ensured that unwanted data are not set into the shift register 23, while at the same time the power consumption of the shift register 23 can be held to a minimum.

In addition, since it is not necessary to use a counter for controlling the supply of a clock signal to the shift register 23, the circuit scale of the overall apparatus can be reduced. Moreover with the above embodiment, after registering of a frame of serial data in the shift register 23 has been completed, if an excess cycle of the clock signal SK occurs, it is immediately detected. Hence as described above, it is possible to eliminate the occurrence of operating errors caused by electrical noise in the connecting lead which transfers the operating clock signal SK from the microcomputer 2. Thus the reliability of operation can be increased.

Second Embodiment

A second embodiment will be described in which the memory control apparatus 4 differs from that of the first embodiment only with respect to the frame configuration of the serial data DI and the circuit arrangement of the command control section, so that description of other portions of the second embodiment (indicated by identical designation numerals to those of the first embodiment) will be omitted, and only the features of difference will be described.

Figure 5:
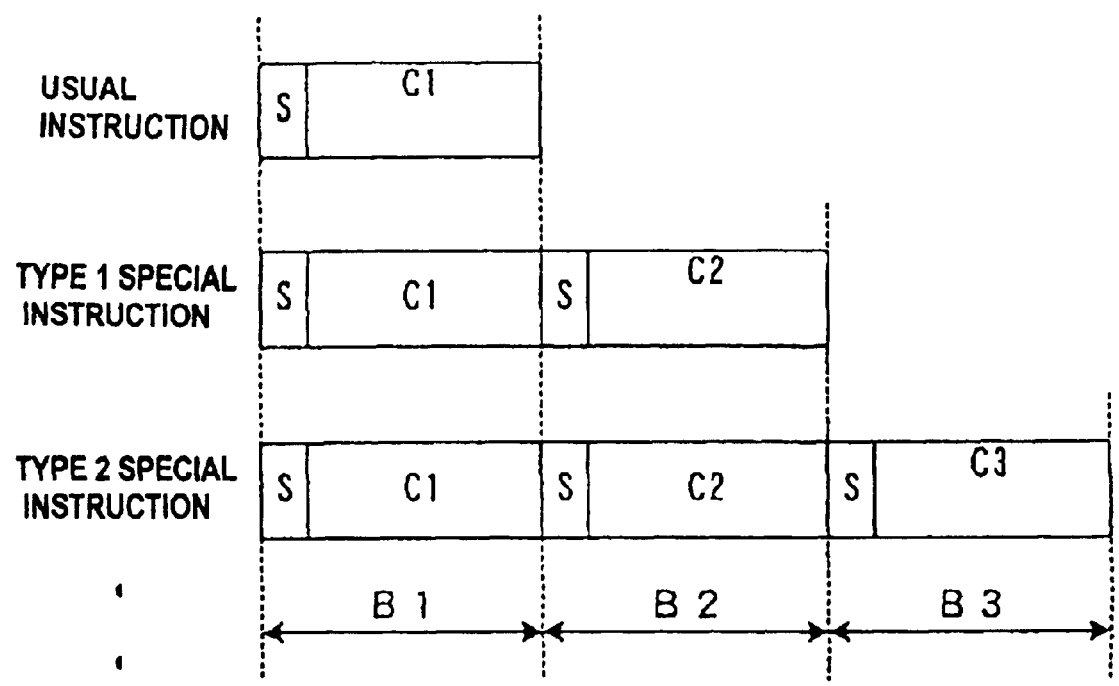
FIG. 5 is a diagram for describing the frame formats of serial data conveying instructions of varying lengths, which are supplied to the second embodiment.

With the second embodiment, as illustrated in FIG. 5, the frame configuration of the serial data DI can be of various lengths, and so can convey instructions of various different types. Specifically, there can be m different types (where m is an arbitrary integer), consisting of a usual instruction, a type 1 special instruction, a type 2 special instruction, ..., a type (m−1) special instruction, which are of respectively different lengths.

In the case of a usual instruction, the frame format consists of a single start bit S, followed by N1 bits of command data C1. In the case of a type 1 special instruction, the frame format consists of that of a usual instruction with a start bit S and a command data portion C2 formed of N2 bits added thereto. In the case of a type 2 special instruction, the frame format consists of that of the type 1 special instruction with a start bit S and a command data portion C3 formed of N3 bits added thereto (where N1, N2, N3 are arbitrary plural integers). In general, in the case of a type i special instruction, where i takes a value in the range 1 to (m−1), the frame format is that of the type (i−1) special instruction followed by a start bit S and a command data portion C(i+1), formed of N(i+1) bits.

Figure 4:
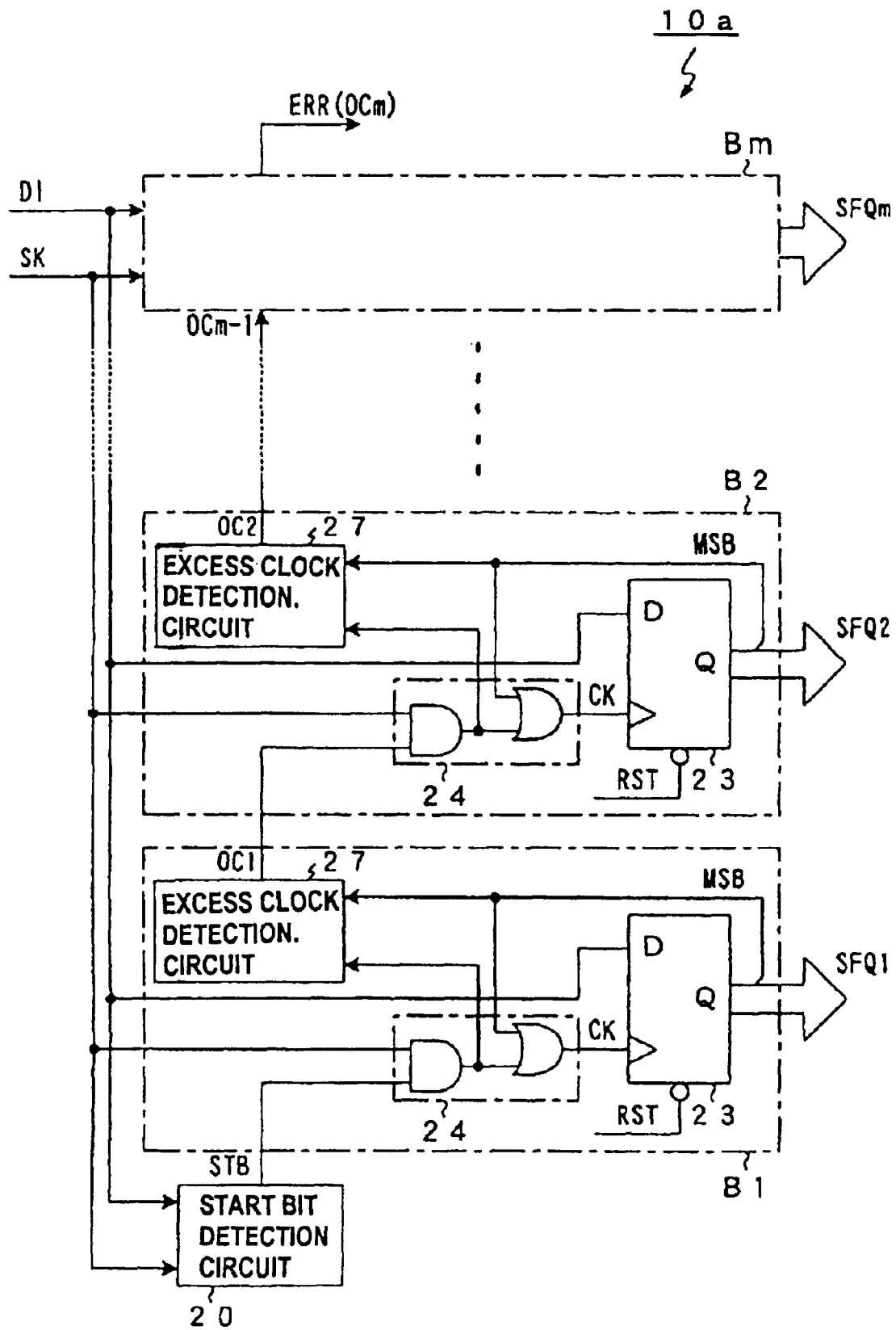
FIG. 4 is a circuit diagram of a second embodiment of a command control section.

As shown in FIG. 4, the command control section of this embodiment, designated as 10a, is formed of a start bit detection circuit 20 and a set of m control blocks B1 to Bm. Each of these control blocks has a configuration which is identical to that of the command control section 10 of the first embodiment as shown in FIG. 2, other in that that the start bit detection circuit 20 is omitted, i.e., each of these control blocks is formed of a shift register 23, a clock supply control circuit 24 and an excess clock detection circuit 27. Designating such a control block as Bi, the shift register 23 of the control block Bi is configured to register a total of N(i+1) bits of a command data portion plus one start bit. The control blocks will be considered as a succession of stages, i.e., with the control block B1 (which receives the start bit detection signal STB) being the first-stage, i.e., lowest-stage control block, and so on.

In the first-stage control block B1, the AND gate 25 receives as inputs the operating clock signal SK and the start bit detection signal STB produced from the start bit detection circuit 20. In each of the remaining control blocks, i.e. the i-th stage control block Bi, the AND gate 25 of that control block receives as inputs the operating clock signal SK and the excess clock detection signal OCi-1 from the excess clock detection circuit 27 of the preceding (lower-stage) control block Bi-1.

The respective sets of parallel output data SFQ1~SFQm from the shift registers 23 of the control blocks B1 to Bm are supplied to the decoder section 12, and in addition the excess clock detection signal OCm from the final-stage control block Bm is supplied to the error control section 16, as the error detection signal ERR.

The operation of the command control section 10a of this embodiment is as follows. When that section has been reset by the reset signal RST, then since the start bit detection signal STB and each of the excess clock detection signals OC1 to OCm are all at the L level, the clock signal SK is not supplied to any of the respective shift registers 23 of the control blocks B1 to Bm. That is, each of the shift registers 23 is held in the inoperative state.

When a usual instruction is supplied to the command control section 10a, as a frame of serial data DI, the start bit detection circuit 20 and the control block B1 operate in combination in the same way as described for the command control section 10 of the first embodiment, with the start bit S and the command data portion C1 being successively registered in the shift register 23 of the control block B1.

Figure 6:
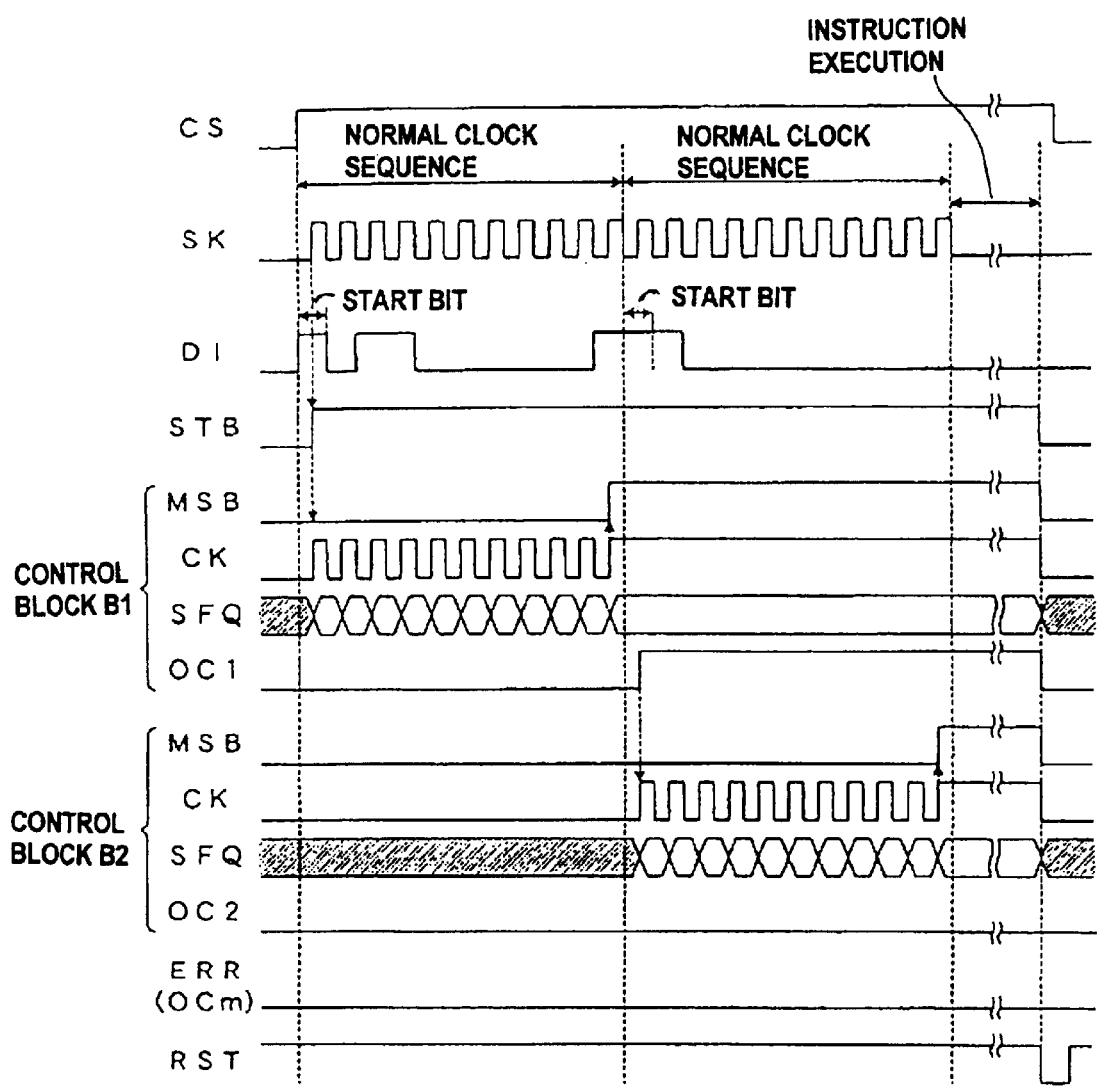
FIG. 6 is a timing diagram for describing the operation of the second embodiment.

If however a type 1 special instruction is input as a frame of serial data DI, then as shown in the timing diagram of FIG. 6, the operation proceeds in the same manner as described hereinabove for the case of a usual instruction being input, until the command data portion C1 has been written into the shift register 23 of the first-stage control block B1. At that point, the MSB output from that shift register 23 attains the H level, and since the clock signal SK continues to be supplied from the microcomputer 2, the excess clock detection signal OC1 goes to the H level. As a result the supply of the clock signal CK to the shift register 23 of the next-stage control block B2 is started. Subsequently, operation proceeds for the control block B2 in the same manner as described for the first-stage control block B1, with the MSB output of the shift register 23 of the control block B2 going to the H level when the start bit S which precedes the command data portion C2 is written into the MSB stage of that shift register, whereupon the supply of the clock signal CK to the shift register 23 of block B2 is halted.

If a type 2 special instruction is received, then after the above sequence of operations has been completed, the same series of operations occurs for the next-stage control block B3, with the command data portion C3 of that instruction being written into the shift register 23 of that control block.

In general, for any control block Bi, the command data portion Ci and the start bit S which appears at the head of the command data portion Ci are set into the shift register 23 of that control block.

The respective bit lengths N1 to Nm of the command data portions can be respectively identical, in which case each of the shift registers of the various control blocks will be configured to register the same number of bits. Alternatively, the command data portions may be of differing lengths, in which case the bit lengths which can be registered by the shift registers of the respective control blocks will differ accordingly.

As can be understood from the above, with each of the control blocks Bi~Bm of this embodiment, the clock signal CK is supplied to the shift register of that control block only when it is necessary for the control block to store all or part of a frame of serial data DI. Hence, it is possible to prevent unnecessary data from being set into the shift register 23 of any control block. In addition, the power consumption of the shift registers 23 can be minimized.

Furthermore with this embodiment, by utilizing a start bit S which occurs at the head of each of the command data portions C1 to Cm, the completion of storing a predetermined number of bits in a shift register 23 of any control block can be monitored by detecting the logic level of the MSB of that shift register 23. Since this monitoring function is achieved without the use of a counter circuit, the overall circuit scale of the apparatus can be minimized. Furthermore due to this manner of use of the start bits contained in the input serial data DI, it becomes possible to utilize variable-length instructions without requiring the provision of one or more terminals for receiving externally supplied signals relating to notification of variable-length instructions. Hence when the memory control apparatus is combined with a memory array in a single IC package, the number of terminals of that IC package can be minimized.

Furthermore with the second embodiment, each command data portion Ci is registered only in the shift register 23 of a specific corresponding control block Bi, irrespective of the overall length (frame length) of an instruction which contains one or more command data portions. Hence, a decoder circuit which operates on these command data portions Ci (i.e., the sets of parallel data outputs SFQ1, SFQ2, etc., in combination) can have a simple configuration. In particular, a set of parallel data SFQ1 conveying the command contents of a usual instruction are always produced from the shift register 23 of the first-stage control block B1, irrespective of how many control blocks B2~Bm are formed.

Furthermore with the second embodiment, the apparatus can be configured to handle instructions of any desired frame length, simply by adding one or more control blocks, each of which have the same configuration. Hence, great flexibility of expansion can be achieved.

Although the invention has been described in the above referring to specific embodiments, the scope of the invention is not limited to these embodiments, and various modifications could be readily envisaged. In particular, although the memory control apparatus 4 and a memory array such as the EEPROM 6 have been described as respectively separate units in the above, these could of course be formed together as a serial memory, in integrated circuit form, on a single IC chip.

Furthermore with the second embodiment, an excess clock detection signal OCi is generated by a control block under the condition that the MSB of the shift register 23 of that control block has changed to the logic level of the start bits and that the clock signal SK continues to be supplied after that change has occurred. However in order to reduce the possibility of operating errors with this embodiment, it would also be possible to set an additional condition, for supplying the excess clock detection signal OCi from the i-th control block as a control signal to the (i+1)-th control block. Specifically (as can be readily understood from the timing diagram of FIG. 6) the further condition could set that "a start bit S of the serial data DI must occur in the clock cycle immediately following the inversion of the MSB output of the shift register of that control block to the H level".

Although in the above description it is assumed that the memory control apparatus is applied to a memory array 6 which is an EEPROM, the invention is equally applicable to other types of memory such as a ROM (read-only memory), RAM (random access memory), etc., in which data are stored and read out as units formed of a plurality of bits.

What is claimed is:

1. A memory control apparatus having serial data registering means coupled to receive externally supplied serial data and an operating clock signal synchronized with said serial data, with said serial data having a frame format of a command data portion of fixed bit length preceded by a start bit, said serial data registering means registering said serial data in accordance with said clock signal, with command data registered in said serial data registering means being applied to control a memory array which receives and outputs data in units of pluralities of bits;

wherein said serial data registering means comprises start bit detection means, responsive to input of a start bit for generating a start bit detection signal, a shift register controlled by said operating clock signal to register a number of bits of said serial data which is equal to said command data portion bit length incremented by one, and adapted to be initialized such that logic levels of all data outputs therefrom are set as the inverse of a logic level of said start bits, prior to newly registering data therein, clock control circuit means functioning, during an interval extending from the start of generating said start bit detection signal until said logic level of a MSB (most significant bit) data output from said shift register is inverted to attain said start bit logic level, to supply said operating clock signal as a shift clock to said shift register, and excess clock detection means responsive to occurrence of at least one cycle of said operating clock signal, subsequent to said inverting of said MSB logic level, for generating an excess clock detection signal.

2. The memory control apparatus according to claim 1, comprising circuit means responsive to said excess clock detection signal for effecting said initializing of said shift register.

3. A serial memory comprising a combination of a memory control apparatus as claimed in claim 1 and a memory array which is controlled by said memory control apparatus, formed as an integrated circuit on a single integrated circuit chip.

4. The serial memory as claimed in claim 3, wherein said memory array is an EEPROM (electronically erasable programmable memory).

5. A memory control apparatus having serial data registering means coupled to receive externally supplied serial data and an operating clock signal synchronized with said serial data, with said serial data having a variable-length frame format of one or more command data portions in a continuous sequence each preceded by a start bit, said serial data registering means registering said serial data in accordance with said clock signal, with command data registered in said data registering means being applied to control a memory array which receives and outputs data in units of pluralities of bits;

wherein said serial data registering means comprises start bit detection means, responsive to input of a start bit for generating a start bit detection signal, and a plurality of control blocks, each comprising a shift register controlled by said operating clock signal to register a total number of bits of said serial data which is equal to a bit length of a command data portion incremented by one, and adapted to be initialized such that logic levels of all data outputs therefrom are set as the inverse of a logic level of said start bits, prior to newly registering data therein, clock control circuit means for supplying said operating clock signal as a shift clock to said shift register during an interval extending from the start of supplying an enabling signal thereto until a logic level of a MSB (most significant bit) output from said shift register is inverted to attain said start bit logic level, and excess clock detection means responsive to occurrence of at least one cycle of said operating clock signal, subsequent to said inverting of said MSB logic level, for generating an excess clock detection signal, wherein said enabling signal which is applied to said clock control circuit means of a first-stage one of said control blocks is constituted by said start bit detection signal, and wherein said enabling signal which is applied to said clock control circuit means of a second stage and each of subsequent stages of said control blocks is constituted by said excess clock detection signal which is produced by an immediately preceding stage of said control blocks.

6. The memory control apparatus according to claim 5, wherein all of said command data portions are of identical bit length.

7. The memory control apparatus according to claim 5, wherein at least a part of said command data portions are of respectively different lengths, and wherein said shift registers of respective ones of said control blocks which register said command data portions of differing lengths are configured to register correspondingly different numbers of bits.

8. A serial memory comprising a combination of a memory control apparatus as claimed in claim 5 and a memory array which is controlled by said memory control apparatus, formed as an integrated circuit on a single integrated circuit chip.

9. The serial memory as claimed in claim 8, wherein said memory array is an EEPROM (electronically erasable programmable memory).

* * * * *